United States Patent
Jeong et al.

(10) Patent No.: US 9,570,621 B2
(45) Date of Patent: Feb. 14, 2017

(54) DISPLAY SUBSTRATE, METHOD OF MANUFACTURING THE SAME

(75) Inventors: Ki-Hun Jeong, Cheonan-si (KR); Do-Hyun Kim, Seongnam-si (KR); Dong-Hoon Lee, Seoul (KR); Kap-Soo Yoon, Seoul (KR); Jae-Ho Choi, Seoul (KR); Sung-Hoon Yang, Seoul (KR); Pil-Sang Yun, Seoul (KR); Seung-Mi Seo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1199 days.

(21) Appl. No.: 12/977,853

(22) Filed: Dec. 23, 2010

(65) Prior Publication Data

US 2011/0147740 A1  Jun. 23, 2011

(30) Foreign Application Priority Data

Dec. 23, 2009  (KR) .......... 10-2009-0129888

(51) Int. Cl.
*H01L 29/10* (2006.01)
*H01L 29/12* (2006.01)
*H01L 29/786* (2006.01)

(52) U.S. Cl.
CPC ..... *H01L 29/7869* (2013.01); *H01L 29/78606* (2013.01); *H01L 29/78633* (2013.01)

(58) Field of Classification Search
CPC .............. H01L 29/78606; H01L 29/78633; H01L 29/7869
USPC ....... 257/43, 59, E27.06, E21.616, E21.078, 257/E29.1, E29.068; 438/34, 104, 149, 438/151, 158; 349/43, 38, 39, 42, 122, 349/138, 142
See application file for complete search history.

(56) References Cited

U.S. PATENT DOCUMENTS

2009/0180045 A1*  7/2009  Yoon et al. ............... 349/43

FOREIGN PATENT DOCUMENTS

| JP | 61-089672 | 5/1986 |
| JP | 02-177563 | 7/1990 |
| JP | 06-350089 | 12/1994 |
| JP | 2000-194003 | 7/2000 |
| JP | 2005-285890 | 10/2005 |
| JP | 2009-253204 | 10/2009 |
| KR | 10-2009-0078568 | 7/2009 |

* cited by examiner

*Primary Examiner* — Meiya Li
(74) *Attorney, Agent, or Firm* — H.C. Park & Associates, PLC

(57) ABSTRACT

The present invention discloses a thin film transistor (TFT), a method for manufacturing the TFT, and a display substrate using the TFT that may prevent degradation of the characteristics of an oxide semiconductor contained in the TFT by blocking external light from entering a channel region of the oxide semiconductor. The TFT includes an oxide semiconductor layer; a protective layer overlapping a channel region of the oxide semiconductor layer; an opaque layer disposed between the oxide semiconductor layer and the protective layer; a source electrode contacting a first side of the oxide semiconductor layer; a drain electrode contacting a second side of the oxide semiconductor layer and facing the source electrode across the channel region; a gate electrode to apply an electric field to the oxide semiconductor layer; and a gate insulating layer disposed between the gate electrode and the oxide semiconductor layer.

22 Claims, 7 Drawing Sheets

DISPLAY SUBSTRATE, METHOD OF MANUFACTURING THE SAME

CROSS REFERENCE TO RELATED APPLICATION

This application claims priority from and the benefit of Korean Patent Application No. 10-2009-0129888, filed on Dec. 23, 2009, which is hereby incorporated by reference for all purposes as if fully set forth herein.

BACKGROUND OF THE INVENTION

Field of the Invention

Exemplary embodiments of the present invention relate to a thin film transistor, a method for manufacturing the same, and a display substrate using the thin film transistor.

Discussion of the Background

A thin film transistor (TFT) may be used as a switching element for a flat panel display device such as a liquid crystal display or an organic light emitting display. For liquid crystal displays currently commercialized, typical channel layers of the thin film transistors include an amorphous silicon layer, and, in those cases, the field effect mobility (hereinafter "mobility") of the TFT is about 0.5 $cm^2/Vs$. Technology for high performance TFTs having higher mobility is now desired since the size of displays is getting larger. Therefore, research has been conducted on using oxide semiconductor materials having higher mobilities than the amorphous silicon materials. Some of these materials include ZnO based materials as the channel layer of the TFT. Ga—In—Zn—O, one of the ZnO based materials, exhibits outstanding semiconductor characteristics since its mobility is more than several tens of times greater than the amorphous silicon layer.

However, once such oxide semiconductor material is exposed to external light, changes of its characteristics such as threshold voltage shifts occur, which result in degradation of display quality.

SUMMARY OF THE INVENTION

Exemplary embodiments of the present invention provide a thin film transistor (TFT) capable of preventing the degradation of semiconductor characteristics by external light, thereby improving display quality.

Exemplary embodiments of the present invention also provide for prevention of the display quality from degradation by virtue of a light-absorbable opaque layer covering the channel region of the oxide semiconductor layer, thereby blocking the external light from flowing into a channel region of a thin film transistor of the display.

Additional features of the invention will be set forth in the description which follows and, in part, will be apparent from the description or may be learned by practice of the invention.

An exemplary embodiment of the present invention discloses a TFT that comprises an oxide semiconductor layer; a protective layer disposed on the oxide semiconductor layer and overlapping a channel region of the oxide semiconductor layer; an opaque layer disposed between the oxide semiconductor layer and the protective layer; a source electrode contacting a first side of the oxide semiconductor layer; a drain electrode contacting a second side of the oxide semiconductor layer and facing the source electrode with the channel region disposed between the drain electrode and the source electrode; a gate electrode to apply an electric field to the oxide semiconductor layer; and a gate insulating layer disposed between the gate electrode and the oxide semiconductor layer.

An exemplary embodiment of the present invention also discloses a display substrate that comprises a gate line disposed on a substrate, a data line crossing the gate line, a TFT connected to the gate line and the data line, and a pixel electrode connected to the TFT. The TFT comprises an oxide semiconductor layer; a first protective layer disposed on the oxide semiconductor layer and overlapping a channel region of the oxide semiconductor layer; a first opaque layer disposed between the oxide semiconductor layer and the protective layer; a source electrode contacting a first side of the oxide semiconductor layer; a drain electrode contacting a second side of the oxide semiconductor layer and facing the source electrode with the channel region disposed between the drain electrode and the source electrode; a gate electrode to apply an electric field to the oxide semiconductor layer; and a gate insulating layer disposed between the gate electrode and the oxide semiconductor layer.

An exemplary embodiment of the present invention further discloses a method for manufacturing a thin film transistor (TFT) that comprises forming a gate electrode on a substrate; forming a gate insulating layer on the gate electrode; forming an oxide semiconductor pattern on the gate insulating layer; forming an opaque pattern on the oxide semiconductor pattern; forming a protective pattern on the opaque pattern; forming a data pattern contacting the oxide semiconductor pattern and including a source electrode and a drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1A:
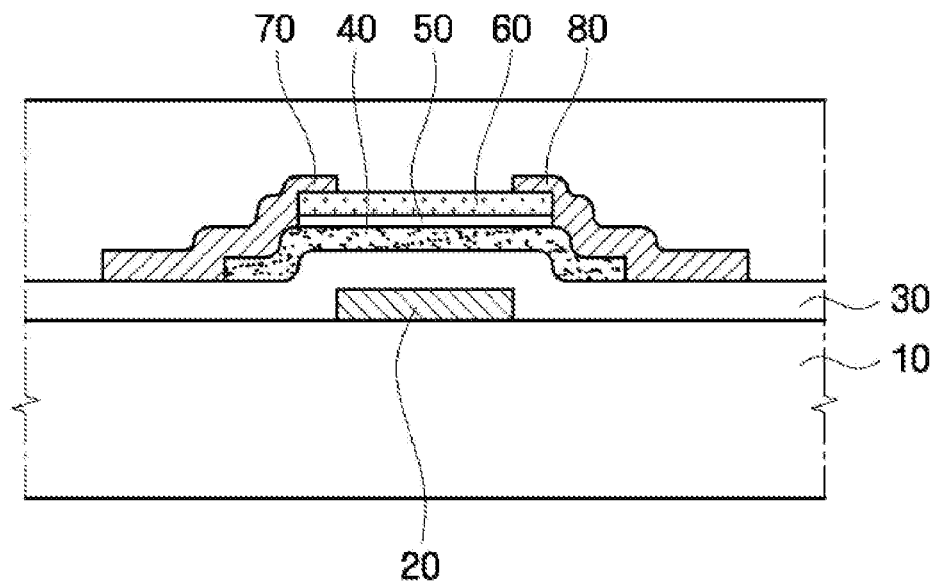
FIG. 1A is a cross-sectional view showing a thin film transistor (TFT) according to a first exemplary embodiment of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, or directly coupled to the other element or layer, or intervening elements or layers may be present. In contrast, when an element is referred to as being "directly on," "directly connected to," or "directly coupled to" another element or layer, no intervening elements or layers are present.

Figure 1B:
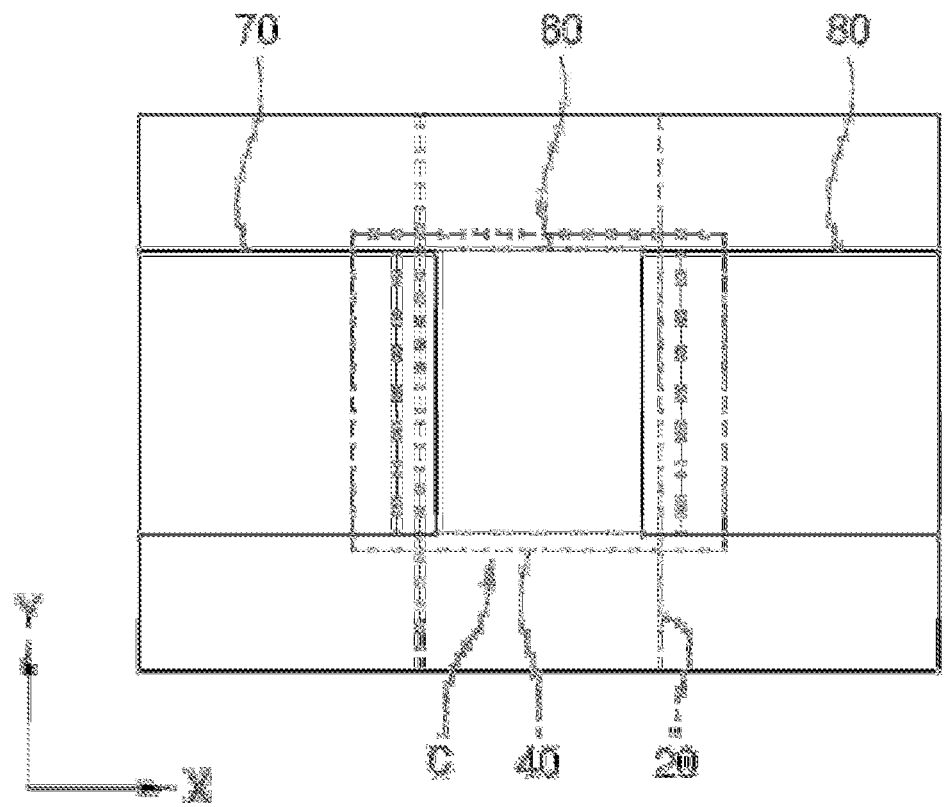
FIG. 1B is a plan view of the TFT shown in FIG. 1A.

FIG. 1A is a cross-sectional view showing a thin film transistor (TFT) according to a first exemplary embodiment of the present invention, and FIG. 1B is a plan view of the TFT shown in FIG. 1A.

Referring to FIG. 1A and FIG. 1B, a gate electrode 20 and a gate insulating layer 30 covering the gate electrode 20 are disposed on a substrate 10. The gate insulating layer 30 may include a single layer that may be composed of silicon oxide (SiOx) or a double layer that may be composed of silicon nitride (SiNx) and SiOx.

An oxide semiconductor layer 40 is disposed on the gate insulating layer 30. The oxide semiconductor layer 40 may include an amorphous oxide including at least one of indium (In), zinc (Zn), gallium (Ga), or hafnium (Hf). For example, the oxide semiconductor layer 40 may be formed by adding Ga or Hf to zinc oxide or to a compound oxide of Zn and In. More specifically, the amorphous oxide layer may be a Ga—In—Zn—O layer as a form of $In_2O_3$—$Ga_2O_3$—ZnO, or the amorphous oxide layer may be an Hf—In—Zn—O layer as a form of $HfO_2$—$In_2O_3$—ZnO.

An opaque layer 50 is disposed on the oxide semiconductor layer 40. The opaque layer 50 may include an amorphous silicon layer. The amorphous silicon layer may have a relatively small band gap of about 1.8 eV such that it may favorably absorb light. The opaque layer 50 may cover the whole upper surface of the oxide semiconductor layer 40, or it may cover a channel region C of the oxide semiconductor layer 40. Accordingly, external light may be prevented from entering the channel region C by the opaque layer 50 that covers at least the channel region C of the oxide semiconductor layer 40.

A protective layer 60 is disposed on the opaque layer 50. The protective layer 60 may function as an etch stopping layer to protect the channel region of the oxide semiconductor layer 40 when a source electrode and a drain electrode (to be described below) are patterned. The protective layer 60 may include SiOx.

If the opaque layer 50 contains an amorphous silicon and the protective layer 60 contains SiOx, the opaque layer 50 and the protective layer 60 may be formed together in a single process. In this case, the protective layer 60 and the opaque layer 50 may have substantially the same planar shape as shown in FIG. 1A and FIG. 1B.

Although the protective layer 60 may have square shape as shown in FIG. 1B, the shape of the protective layer 60 and the opaque layer 50 may be modified in various ways. Moreover, although not shown in the figures, the opaque layer 50 may be disposed on the protective layer 60.

A source electrode 70 overlapping a portion of the oxide semiconductor layer 40 and a drain electrode 80 separated from the source electrode 70 and overlapping another portion of the oxide semiconductor layer 40 are disposed on the protective layer 60. The source electrode 70 and the drain electrode 80 may include a metal layer. The metal layer may include a single layer or a multi-layer that may include at least one of Al, Mo, Ti, or Cu.

A TFT according to a second exemplary embodiment of the present invention is described now. In the description, explanations for the same components as the TFT of the first exemplary embodiment are omitted.

Figure 2A:
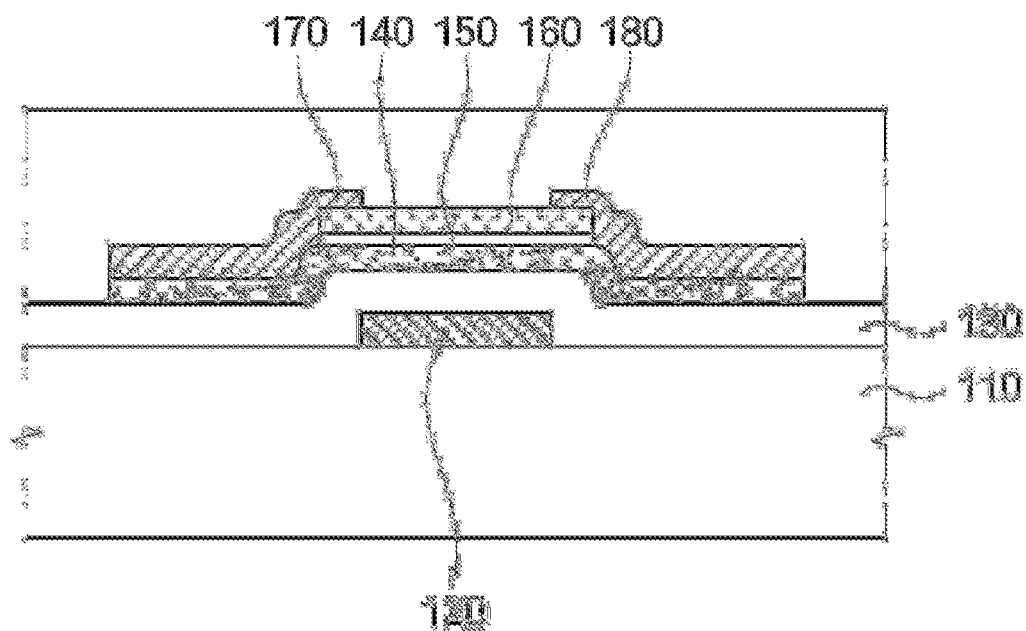
FIG. 2A is a cross-sectional view showing a TFT according to a second exemplary embodiment of the present invention.
Figure 2B:
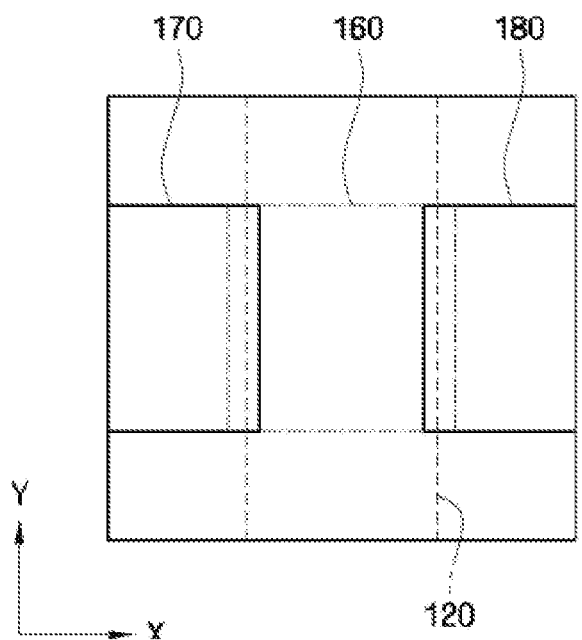
FIG. 2B is a plan view of the TFT shown in FIG. 2A.

FIG. 2A is a cross-sectional view showing a TFT according to a second exemplary embodiment of the present invention, and FIG. 2B is a plan view of the TFT shown in FIG. 2A.

As described, a gate electrode 120 and a gate insulation layer 130 covering the gate electrode 120 are disposed on a substrate 110. An oxide semiconductor layer 140, which may include an amorphous oxide that may include at least one of In, Zn, Ga, or Hf, is disposed on the gate insulating layer 130.

An opaque layer 150 and a protective layer 160 are subsequently disposed on a channel region of the oxide semiconductor layer 140. The opaque layer 150 may include an amorphous silicon layer, and the protective layer 160 may include a SiOx layer. As in the first exemplary embodiment, the opaque layer 150 may be disposed on the protective layer 160.

A source electrode 170 overlapping one portion of the oxide semiconductor layer 140 and a drain electrode 180 separated from the source electrode 170 and overlapping another portion of the oxide semiconductor layer 140 are disposed on the protective layer 160. The source electrode 170 and the drain electrode 180 may include metal layers. The metal layer may include a single layer or a multi-layer that may include at least one of Al, Mo, Ti, or Cu.

In the present exemplary embodiment, the source electrode 170 and the drain electrode 180 may have substantially the same planar shape as the semiconductor layer 140 except for the channel region of the oxide semiconductor layer 140. These planar shapes may be formed by patterning the source electrode 170, the drain electrode 180, and the oxide semiconductor layer 140 with a single mask, e.g., a photolithography mask, which results in reduction of manufacturing costs.

Although only cases where the oxide semiconductor layer 140 is disposed on the gate electrode 120 are described in the first exemplary embodiment and the second exemplary embodiment, the channel region may be disposed under the gate electrode 120.

Hereinafter, a method for manufacturing the TFT according to the first exemplary embodiment of the present invention is described with reference to FIG. 3A, FIG. 3B, FIG. 3C, and FIG. 3D.

FIG. 3A, FIG. 3B, FIG. 3C, and FIG. 3D are cross-sectional views showing the development of a TFT using a method of manufacturing the TFT according to the first exemplary embodiment of the present invention.

Figure 3A:
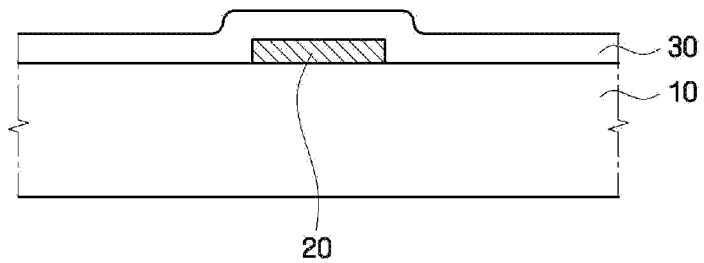
FIG. 3A, FIG. 3B, FIG. 3C, and FIG. 3D are cross-sectional views showing the development of a TFT using a method of manufacturing the TFT according to the first exemplary embodiment of the present invention.

Referring to FIG. 3A, a gate electrode 20 is formed on the substrate 10, and then a gate insulating layer 30 is formed on the substrate 10 to cover the gate electrode 20. The gate insulating layer 30 may be formed by depositing a single layer of SiOx on the substrate 10 or by subsequently depositing SiNx and SiOx on the substrate 10.

Figure 3B:
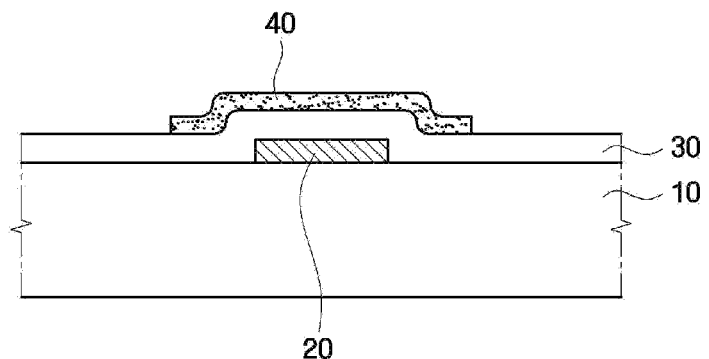
Figure 3C:
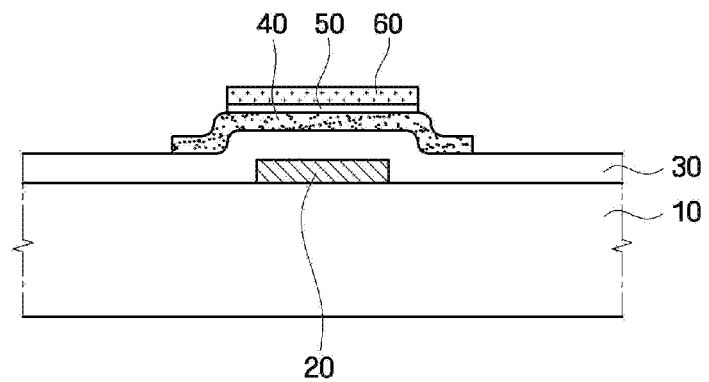

Referring to FIG. 3B, an oxide semiconductor layer 40 is formed by patterning oxide material deposited on the gate insulation layer 30 by methods such as chemical vapor deposition (CVD), atomic layer deposition (ALD), or solution processing. The oxide semiconductor layer 40 may include an amorphous oxide that may include at least one of In, Zn, Ga, or Hf. For example, if a Ga—In—Zn—O layer is formed by a sputtering process, a plurality of sputtering targets that may include $In_2O_3$, $Ga_2O_3$, and ZnO, respectively, may be used, or a single sputtering target that may include Ga—In—Zn oxide may be used. If a Hf—In—Zn—O layer is formed by a sputtering process, a plurality of sputtering target that may include $HfO_2$, $In_2O_3$, and ZnO, respectively, may be used, or a single sputtering target that may include Hf—In—Zn oxide may be used On the oxide semiconductor layer 40, for example, an amorphous silicon layer and an SiOx layer may be formed subsequently. Then, an opaque layer 50 and a protective layer 60 are formed together by patterning the amorphous silicon layer and the SiOx layer simultaneously with a single mask, e.g., a photolithography mask, as shown in FIG. 3C. The patterning process may include dry etching the amorphous silicon layer and the SiOx layer. The opaque layer 50 and the protective layer 60 may be patterned to cover the whole upper surface of the oxide semiconductor layer 40 or to cover only the channel region of the semiconductor layer 40 as shown in FIG. 3C.

Figure 3D:
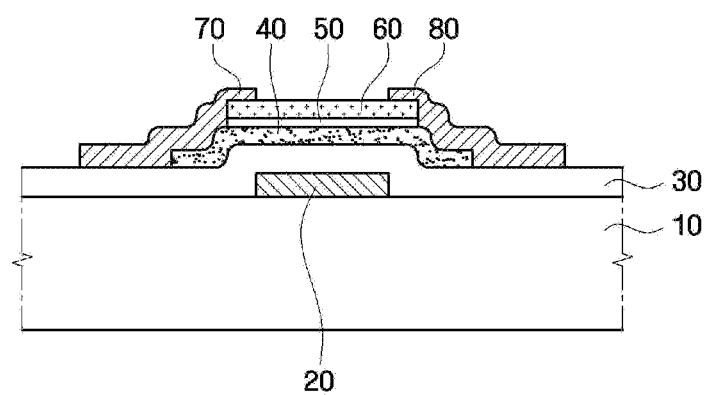

Referring to FIG. 3D, a metal layer (not shown) may be formed on the substrate 10 to cover the protective layer 60 and the semiconductor layer 40, and then the metal layer may be patterned to form a source electrode 70 and a drain electrode 80. The metal layer may include a single layer or a multi-layer that may include of at least one of Al, Mo, Ti, or Cu.

Hereinafter, a method for manufacturing the TFT according to the second exemplary embodiment of the present invention is described with reference to FIG. 4A, FIG. 4B, FIG. 4C, FIG. 4D, FIG. 4E, and FIG. 4F. In the description below, the same processes used for manufacturing the TFT of the first exemplary embodiment will not be described again.

FIG. 4A, FIG. 4B, FIG. 4C, FIG. 4D, FIG. 4E, and FIG. 4F are cross-sectional views showing the development of a TFT using a method of manufacturing the TFT according to the second exemplary embodiment of the present invention.

Figure 4A:
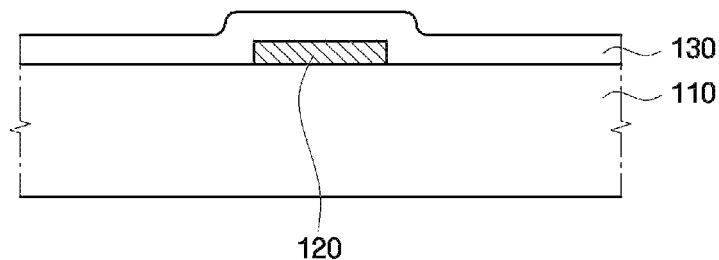
FIG. 4A, FIG. 4B, FIG. 4C, FIG. 4D, FIG. 4E, and FIG. 4F are cross-sectional views showing the development of a TFT using a method of manufacturing the TFT according to the second exemplary embodiment of the present invention.

Referring to FIG. 4A, a gate electrode 120 and a gate insulating layer 130 are formed on a substrate 110 subsequently.

Figure 4B:
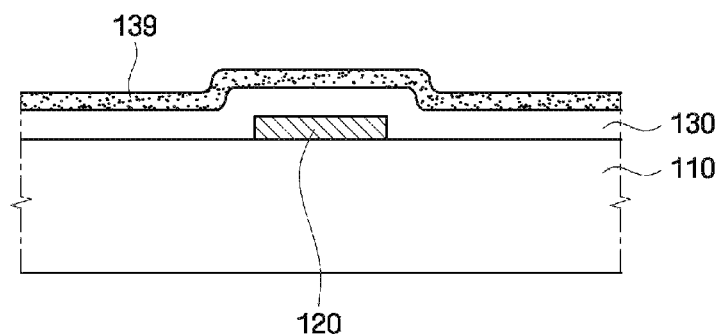

Referring to FIG. 4B, an amorphous oxide layer 139 is formed on the substrate 110 to cover the gate insulating layer 130. The amorphous oxide layer 139 may be formed by methods such as CVD, ALD, or a solution process. The amorphous oxide layer 139 may include at least one of In, Zn, Ga, or Hf. For example, if a Ga—In—Zn—O layer is formed by a sputtering process, a plurality of sputtering targets that may include $In_2O_3$, $Ga_2O_3$, and ZnO, respectively, may be used, or a single sputtering target including Ga—In—Zn oxide may be used. Additionally, if a Hf—In—Zn—O layer is formed by a sputtering process, a plurality of sputtering targets including $HfO_2$, $In_2O_3$, and ZnO, respectively, may be used, or a single sputtering target including Hf—In—Zn oxide may be used.

Figure 4C:
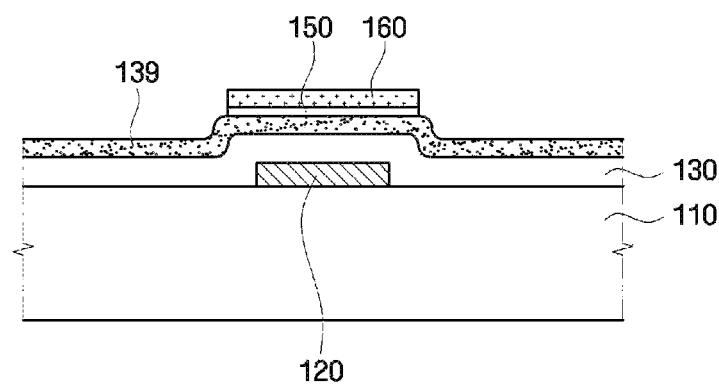

Referring to FIG. 4C, an opaque layer 150 and a protective layer 160 is formed on the amorphous oxide layer 139. The opaque layer 150 and the protective layer 160 may be formed together by depositing, for example, an amorphous silicon layer and a SiOx layer subsequently followed by dry etching the two layers simultaneously.

Figure 4D:
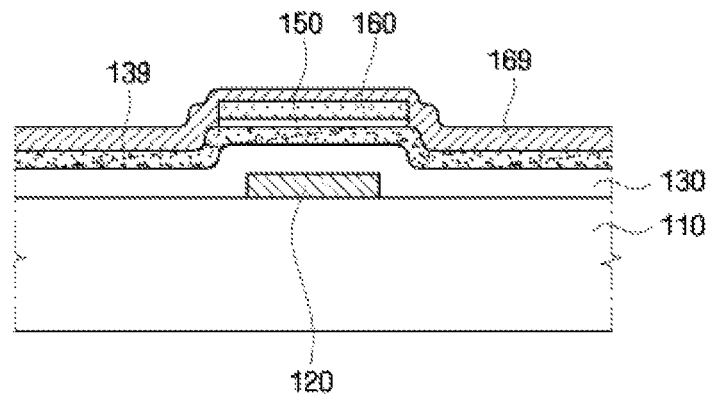

Referring to FIG. 4D, a metal layer 169 is formed on the substrate 110 to cover the protective layer 160 and the amorphous oxide layer 139. The metal layer 169 may be a single layer or a multi-layer that may include at least one of Al, Mo, Ti, or Cu.

Figure 4E:
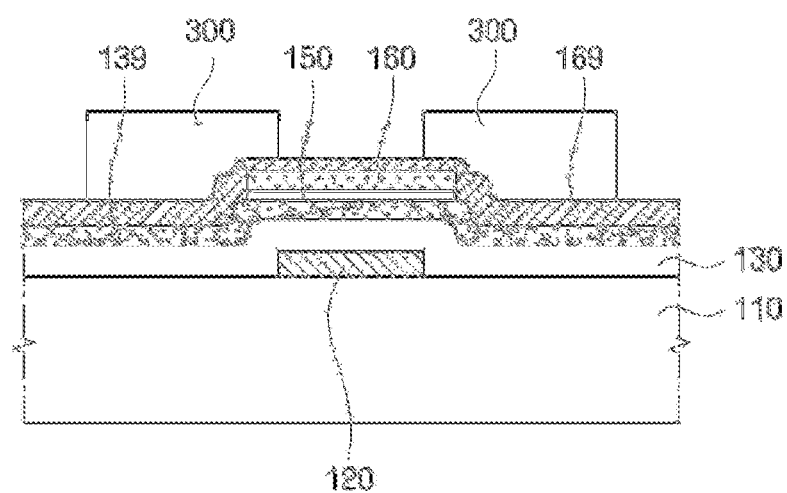

Referring to FIG. 4E, a photoresist pattern 300 is formed on the metal layer 169. As shown in FIG. 4E, the photoresist pattern 300 is formed to expose a portion of the metal layer 169 corresponding to the amorphous oxide region where a channel of the TFT is to be formed.

Figure 4F:
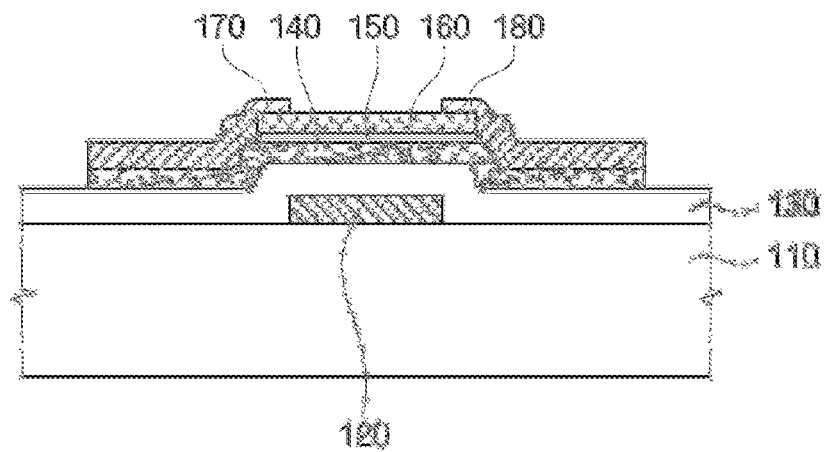

Referring to FIG. 4F, a source electrode 170, a drain electrode 180, and an oxide semiconductor layer 140 are formed together by simultaneously wet etching the metal layer 169 and the amorphous oxide layer 139 by using the photoresist pattern 300 as a mask. Accordingly, the source electrode 170 and drain electrode 180 are formed to have substantially the same planar shape as the oxide semiconductor layer 140. In this case, a single photo mask may be used to pattern the source electrode 170, the drain electrode 180, and the oxide semiconductor layer 140, which results in reduction of manufacturing costs.

Figure 5:
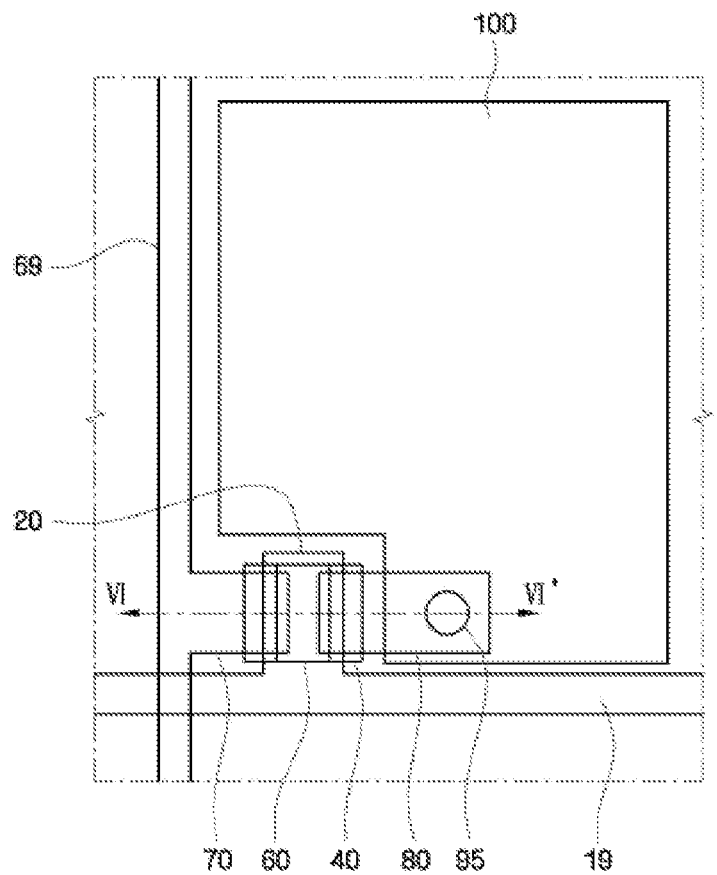
FIG. 5 is a plan view showing a pixel of a display substrate having a TFT according to the first exemplary embodiment of the present invention.
Figure 6:
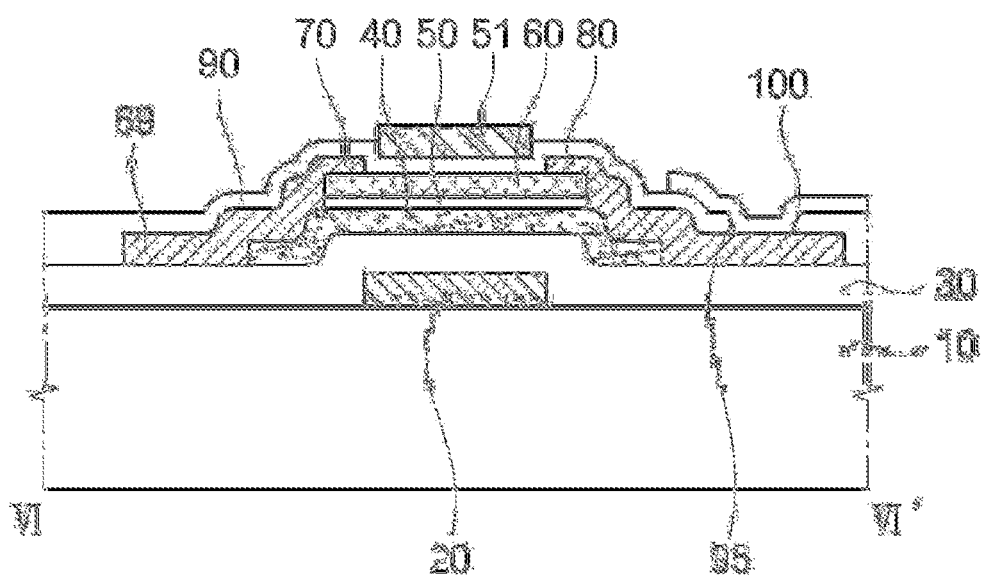
FIG. 6 is a cross-sectional view of the display substrate taken along line VI-VI' shown in FIG. 5.

Hereinafter, a display substrate using the TFT according to the first exemplary embodiment of the present invention with reference to FIG. 5 and FIG. 6 is described. In the description, explanations for the same structures as the TFT of the first exemplary embodiment are not repeated.

FIG. 5 is a plan view showing a pixel of a display substrate having a TFT according to the first exemplary embodiment of the present invention, and FIG. 6 is a cross-sectional view of the display substrate taken along line VI-VI' of FIG. 5.

Referring to FIG. 5 and FIG. 6, a gate line 19 extending along a first direction, a data line 69 extending along a second direction crossing the first direction and insulated from the gate line 19, and a TFT connected to the gate line 19 and the data line 69 are disposed on a substrate 10.

The TFT includes a gate electrode 20 connected to the gate line 19, a gate insulating layer 30 covering the gate electrode 20, an oxide semiconductor layer 40 disposed on the gate insulating layer 30 and overlapping the gate electrode 20, a source electrode 70 connected to the data line 69, and a drain electrode 80 separated from the source electrode 70 with a channel region of the oxide semiconductor layer 40 therebetween.

An opaque layer 50 overlapping the channel region and a first protective layer 60 covering the opaque layer 50 are disposed between the oxide semiconductor layer 40 and the source electrode 70 and the drain electrode 80. The opaque layer 50 may include an amorphous silicon layer. The amorphous silicon layer may have a relatively small band gap of about 1.8 eV such that it may favorably absorb light, and, therefore, the characteristics of the oxide semiconductor layer 40 may be prevented from degradation caused by external light, i.e., light incident between the source electrode 70 and the drain electrode 80 that impinges the oxide semiconductor layer 40.

The first protective layer 60 may include a SiOx layer. As shown in FIG. 5 and FIG. 6, the opaque layer 50 and the first protective layer 60 may be formed to have substantially the same planar shape.

Although the protective layer 60 and the opaque layer 50 are shown to have a rectangular shape in FIG. 5, the shape of the two layers may be modified in various ways. Moreover, although not shown in the figures, the opaque layer 50 may be disposed on the protective layer 60.

A second protective layer 90 is disposed on the substrate 10 to cover the gate line 19, the data line 69, and the TFT except for a portion of the drain electrode 80. The second protective layer 90 may include a single layer of SiNx or a multi-layer of SiOx and SiNx. An additional opaque layer 51 overlapping the channel region may be disposed on the second protective layer 90 so that light may be more efficiently prevented from entering the channel region.

A pixel electrode 100 connected to the drain electrode 80 through a contact hole 95 formed in the second protective layer 90 is disposed on the second protective layer 90. The pixel electrode 100 may include a transparent conductive material such as indium tin oxide (ITO) or indium zinc oxide (IZO).

Figure 7:
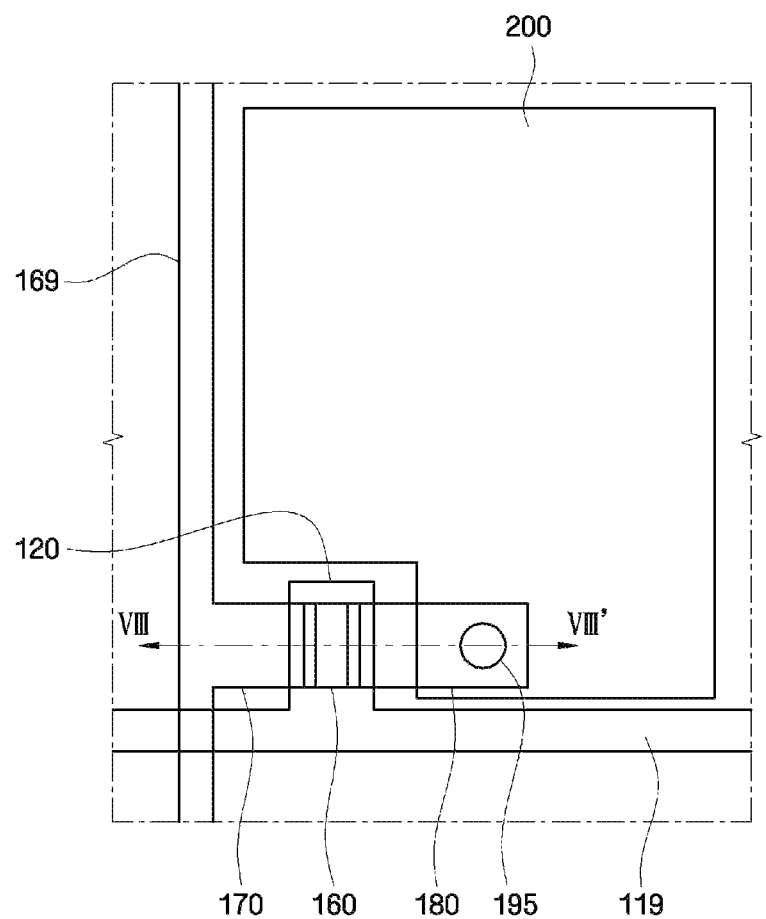
FIG. 7 is a plan view showing a pixel of a display substrate having a TFT according to the second exemplary embodiment of the present invention.
Figure 8:
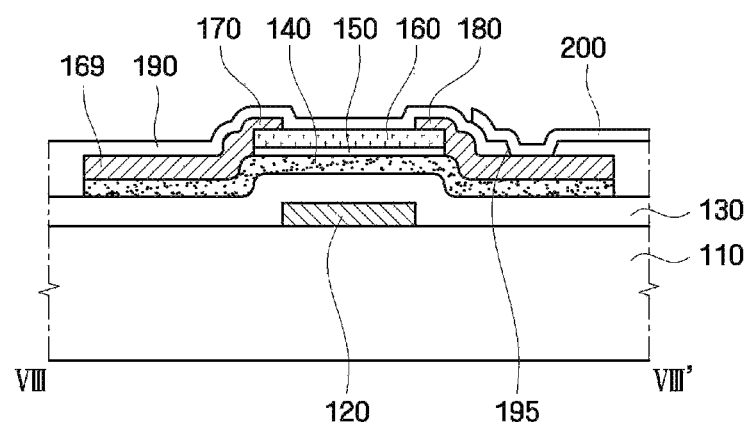
FIG. 8 is a cross-sectional view of the display substrate taken along line VIII-VIII' shown in FIG. 7.

Hereinafter, a display substrate using the TFT according to the second exemplary embodiment of the present invention with reference to FIG. 7 and FIG. 8 is described. In the description, explanations for the same structures as the TFT of the second exemplary embodiment and the display substrate using the TFT of the first exemplary embodiment are not repeated.

FIG. 7 is a plan view showing a pixel of a display substrate having a TFT according to the second exemplary embodiment of the present invention, and FIG. 8 is a cross-sectional view of the display substrate taken along line VIII-VIII' shown in FIG. 7.

Referring to FIG. 7 and FIG. 8, a gate line 119 extending along a first direction, a data line 169 extending along a second direction crossing the first direction and insulated from the gate line 119, and a TFT connected to the gate line 119 and the data line 169 are disposed on a substrate 110.

The TFT includes a gate electrode 120 connected to the gate line 119, a gate insulating layer 130 covering the gate electrode 120, an oxide semiconductor layer 140 disposed on the gate insulating layer 130 and overlapping the gate electrode 120, a source electrode 170 connected to the data line 169, and a drain electrode 180 separated from the source electrode 170 with a channel region of the oxide semiconductor layer 140 therebetween.

As shown in FIG. 7 and FIG. 8, except for its channel region, the oxide semiconductor layer 140 according to the present exemplary embodiment may have substantially the same planar shape as the data line 169, the source electrode 170, and the drain electrodes 180. Therefore, unlike the display substrate according to the first exemplary embodiment, the oxide semiconductor layer 140 is disposed under the data line 169 as well as on the gate electrode 140.

An opaque layer 150 overlapping the channel region and a first protective layer 160 covering the opaque layer 150 are disposed between the oxide semiconductor layer 140 and the source electrode 170 and the drain electrode 180.

Although not shown in the figures, the opaque layer 150 may be disposed on the protective layer 160.

A second protective layer 190 is disposed on the substrate 110 to cover the gate line 119, the data line 169, and the TFT except for a portion of the drain electrode 180.

An additional opaque layer (not shown) overlapping the channel region may be disposed on the second protective layer 190 so that light may be prevented from entering the channel region more efficiently.

A pixel electrode 200 connected to the drain electrode 180 through the contact hole 195 formed in the second protective layer 190 is disposed on the second protective layer 190.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A thin film transistor (TFT), comprising:
   an oxide semiconductor layer;
   a protective layer disposed on the oxide semiconductor layer and overlapping a channel region of the oxide semiconductor layer, the protective layer being an electrical insulator;
   an opaque layer disposed between the oxide semiconductor layer and the protective layer;
   a source electrode disposed on a first side of the oxide semiconductor layer;
   a drain electrode disposed on a second side of the oxide semiconductor layer and facing the source electrode with the channel region disposed between the drain electrode and the source electrode;
   a gate electrode configured to apply an electric field to the oxide semiconductor layer; and
   a gate insulating layer disposed between the gate electrode and the oxide semiconductor layer.

2. The TFT of claim 1, wherein the opaque layer comprises an amorphous silicon layer.

3. The TFT of claim 2, wherein the opaque layer comprises substantially the same planar shape as the protective layer.

4. The TFT of claim 3, wherein the protective layer comprises silicon oxide ($SiO_x$).

5. The TFT of claim 2, wherein the oxide semiconductor layer comprises an amorphous oxide, the amorphous oxide comprising at least one of indium (In), zinc (Zn), gallium (Ga), and hafnium (Hf).

6. The TFT of claim 5, wherein the amorphous oxide comprises In, Zn, and Ga.

7. The TFT of claim 5, wherein the amorphous oxide comprises In, Zn, and Hf.

8. The TFT of claim 5, wherein the opaque layer comprises substantially the same planar shape as the protective layer.

9. The TFT of claim 8, wherein the protective layer comprises silicon oxide ($SiO_x$).

10. The TFT of claim 5, wherein the gate insulating layer comprises silicon oxide ($SiO_x$).

11. A display substrate, comprising:
    a gate line disposed on a substrate, a data line crossing the gate line, a thin film transistor (TFT) connected to the gate line and the data line, and a pixel electrode connected to the TFT, wherein, the TFT comprises:
    an oxide semiconductor layer;
    a protective layer disposed on the oxide semiconductor layer and overlapping a channel region of the oxide semiconductor layer, the protective layer being an electrical insulator;
    an opaque layer disposed between the oxide semiconductor layer and the protective layer;
    a source electrode disposed on a first side of the oxide semiconductor layer;

a drain electrode disposed on a second side of the oxide semiconductor layer and facing the source electrode with the channel region disposed between the drain electrode and the source electrode;

a gate electrode configured to apply an electric field to the oxide semiconductor layer; and a gate insulating layer disposed between the gate electrode and the oxide semiconductor layer.

12. The display substrate of claim 11, wherein the opaque layer comprises an amorphous silicon layer.

13. The display substrate of claim 12, wherein the opaque layer comprises substantially the same planar shape as the protective layer.

14. The display substrate of claim 13, wherein the protective layer comprises silicon oxide (SiOx).

15. The display substrate of claim 12, wherein the oxide semiconductor layer comprises an amorphous oxide, the amorphous oxide comprising at least one of indium (In), zinc (Zn), gallium (Ga), and hafnium (Hf).

16. The display substrate of claim 15, wherein the amorphous oxide comprises In, Zn, and Ga.

17. The display substrate of claim 15, wherein the amorphous oxide comprises In, Zn, and Hf.

18. The display substrate of claim 15, wherein the opaque layer comprises substantially the same planar shape as the protective layer.

19. The display substrate of claim 18, wherein the protective layer comprises silicon oxide ($SiO_x$).

20. The display substrate of claim 15, wherein the gate insulating layer comprises silicon oxide ($SiO_x$).

21. The display substrate of claim 12, wherein:
the protective layer is a first protective layer;
the opaque layer is a first opaque layer; and
the display substrate further comprises:
a second protective layer disposed between the TFT and the pixel electrode and comprising a contact hole through which the drain electrode and the pixel electrode are connected to each other; and
a second opaque layer disposed on the second protective layer and overlapping the channel region.

22. The display substrate of claim 12, wherein the oxide semiconductor layer is disposed under the data line.

* * * * *